United States Patent
Wang et al.

(10) Patent No.: US 8,530,983 B2
(45) Date of Patent: Sep. 10, 2013

(54) PIEZO-PHOTOTRONIC EFFECT DEVICES

(75) Inventors: Zhong L. Wang, Marietta, GA (US); Qing Yang, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 0 days.

(21) Appl. No.: 13/252,314

(22) Filed: Oct. 4, 2011

(65) Prior Publication Data
US 2012/0256160 A1     Oct. 11, 2012

Related U.S. Application Data

(60) Provisional application No. 61/473,345, filed on Apr. 8, 2011.

(51) Int. Cl.
*H01L 29/84* (2006.01)

(52) U.S. Cl.
USPC .......................................................... 257/415

(58) Field of Classification Search
USPC ................... 257/12, E21.002, E29.069, 415; 977/762; 438/466
See application file for complete search history.

(56) References Cited

PUBLICATIONS

X. D. Wang, J. Zhou, J. H. Song, J. Liu, N. S. Xu, and Z. L. Wang; Piezoelectric Field Effect Transistor and Nanoforce Sensor Based on a Single ZnO Nanowire; publ date Nov. 22, 2008; ACS Publications; Nano Lett. 6, 2768 (2006).*

Rusen. S. Yang, Y. Qin, L.M. Dai, Z.L. Wang; Power generation with laterally packaged piezoelectric fine wires; Nov. 8, 2008; Nature Publishing Group; Nat. Nanotechnol. 4 (2009) 34-39.*

Ya Yang, Wen Guo, Junjie Qi, Jing Zhao, Yue Zhang; Self-powered ultraviolet photodetector based on a single Sb-doped ZnO nanobelt; Dec. 3, 2010; American Institute of Physics; Applied Physics Letters, 97, 223113 (2010).*

D. J. Rogers, F.H. Teherani, A. Yasan, K. Minder, P. Kung, M. Razeghi; Electroluminescence at 375 nm from a ZnO/GaN:Mg/c-Al2O3 heterojunction light emitting diode; Apr. 6, 2006; American Institute of Physics; Appl. Phys. Letters, 88, 141918 (2006).*

O. Lupan, T. Pauporté, B. Viana, and P. Aschehoug; Electrodeposition of Cu-doped ZnO nanowire arrays and heterojunction formation with p-GaN for color tunable light emitting diode applications; Feb. 18, 2011; Elsevier; Electrochimica Acta 56 (2011) 10543-10549.*

Zhong Lin Wang; Piezopotential gated nanowire devices: Piezotronics and piezo-phototronics; Dec. 2010; Elsevier; Nano Today (2010) 5, 540-552.*

* cited by examiner

*Primary Examiner* — Matthew Landau
*Assistant Examiner* — Pavel Ivanov
(74) *Attorney, Agent, or Firm* — Bryan W. Bockhop; Bockhop & Associates, LLC

(57) ABSTRACT

A semiconducting device includes a piezoelectric structure that has a first end and an opposite second end. A first conductor is in electrical communication with the first end and a second conductor is in electrical communication with the second end so as to form an interface therebetween. A force applying structure is configured to maintain an amount of strain in the piezoelectric member sufficient to generate a desired electrical characteristic in the semiconducting device.

14 Claims, 3 Drawing Sheets

PIEZO-PHOTOTRONIC EFFECT DEVICES

CROSS-REFERENCE TO RELATED APPLICATION(S)

This application claims the benefit of U.S. Provisional Patent Application Ser. No. 61/473,345, filed Apr. 8, 2011, the entirety of which is hereby incorporated herein by reference.

STATEMENT OF GOVERNMENT INTEREST

This invention was made with government support under contract No. DE-FG02-07ER46394, awarded by the Department of Energy. The government has certain rights in the invention.

BACKGROUND OF THE INVENTION

1. Field of the Invention

The present invention relates to semiconducting devices and, more specifically, to a piezoelectric semiconductor device.

2. Description of the Related Art

Semiconductor devices are used in many different applications, including diodes, transistors, light emitting devices and sensing devices. While such semiconducting devices can be considerably more efficient than their macro-scale electrical counterparts, they still use a considerable amount of energy. Such energy usage can result in several disadvantageous phenomena, such as increased heat output and shortened battery life.

Therefore, there is a need for semiconducting structures with greater efficiency.

SUMMARY OF THE INVENTION

The disadvantages of the prior art are overcome by the present invention which, in one aspect, is a semiconducting device that includes a piezoelectric structure that has a first end and an opposite second end. A first conductor is in electrical communication with the first end and a second conductor is in electrical communication with the second end so as to form an interface therebetween. A force applying structure is configured to maintain an amount of strain in the piezoelectric member sufficient to generate a desired electrical characteristic in the semiconducting device.

In another aspect, the invention is a method of making a semiconducting device, in which a piezoelectric member, having a first end and an opposite second end, is placed on a flexible substrate. A first conductor is affixed to the first end. A second conductor is affixed to the second end so as to form an interface therebetween. The second conductor includes a material that forms with the piezoelectric member at the interface a selected one of a p-n junction or a Schottky contact. A predetermined amount of strain is applied to the piezoelectric member so as to generate a desired electrical characteristic in the semiconducting device.

These and other aspects of the invention will become apparent from the following description of the preferred embodiments taken in conjunction with the following drawings. As would be obvious to one skilled in the art, many variations and modifications of the invention may be effected without departing from the spirit and scope of the novel concepts of the disclosure.

DETAILED DESCRIPTION OF THE INVENTION

Figure 1:
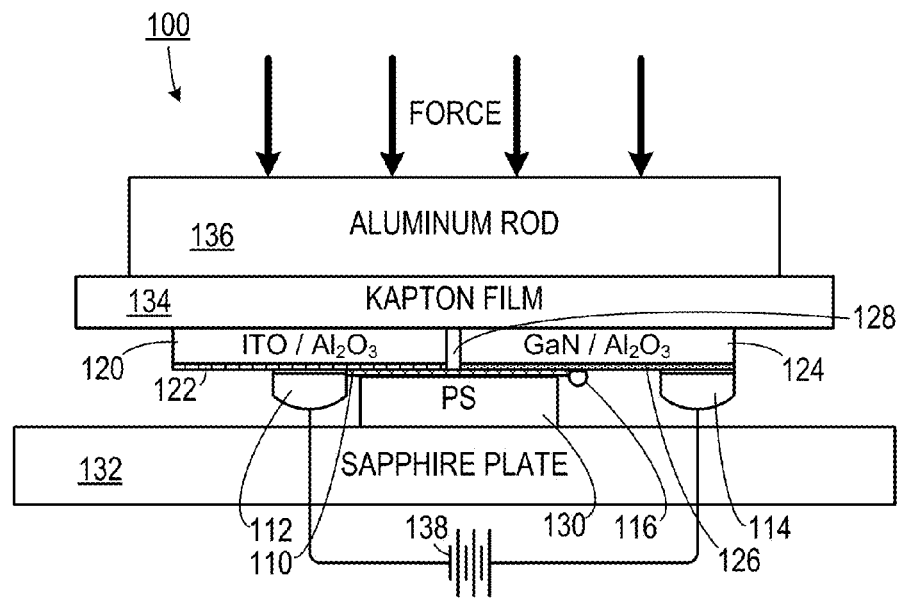
FIG. 1 is a schematic diagram of a light emitting semiconducting device.

A preferred embodiment of the invention is now described in detail. Referring to the drawings, like numbers indicate like parts throughout the views. Unless otherwise specifically indicated in the disclosure that follows, the drawings are not necessarily drawn to scale. As used in the description herein and throughout the claims, the following terms take the meanings explicitly associated herein, unless the context clearly dictates otherwise: the meaning of "a," "an," and "the" includes plural reference, the meaning of "in" includes "in" and "on."

U.S. patent application Ser. No. 12/945,077 filed Nov. 12, 2010 by Wang et al. discloses methods of making piezo-phototronic devices and is incorporated herein by reference.

As shown in FIG. 1, one embodiment of a piezoelectric semiconductor includes a light emitting device 100. This embodiment includes a piezoelectric structure 110 that can include, for example, ZnO, GaN, or a wurtzite structured material. In one embodiment, the piezoelectric structure 110 includes a ZnO nanowire. An ITO film 122 is deposited on an $Al_2O_3$ substrate 120 and a conductor 112 is placed in electrical communication with both the ITO film 122 and the piezoelectric structure 110. Another $Al_2O_3$ substrate 124 has an Mg-doped GaN film 126 deposited thereon. The piezoelectric structure 110 is affixed to the Mg-doped GaN film 126 by an attaching substance 116 and a conductor 114 is placed in electrical communication with the Mg-doped GaN film 126. A gap 128 is defined between the two $Al_2O_3$ substrates 122 and 124 and it is bridged by the piezoelectric structure 110. The two $Al_2O_3$ substrates 122 and 124 are affixed to a polyimide film 134 (such as Kapton). A clear rigid plate 132 (such as a sapphire plate) has a resilient pad 130 (such as a piece of polystyrene) affixed thereto. The transparent resilient layer 130 is placed against the piezoelectric structure 110. A force is applied to the polyimide film 134 by means of a metal rod 136, which causes differential bending of the piezoelectric structure 110, thereby maintaining a strain therein. When a voltage source 138 applies a potential between the electrical contacts 112 and 114, the device emits light.

In one experimental embodiment, the piezo-phototronic effect has been effectively utilized to enhance the external efficiency of an LED 100 fabricated using a single ZnO micro-/nano-wire 110 on a GaN substrate 126. The emission light intensity and injection current at a fixed applied voltage has been enhanced by a factor of 17 and 4 after applying a 0.093% compressive strain, respectively, and the corresponding conversion efficiency was improved by a factor of 4.25. This is suggested arising from an effective increase in the local "biased voltage" as a result of the band modification caused by piezopotential and the trapping of free carriers at the interface region in a channel created by the piezopotential near the interface. Furthermore, the piezoresistance and piezooptic (photoelastic) effects have been utilized to tune the light emitting intensity, spectra and polarization simultaneously. The piezo-phototronic effect can be effectively used for enhancing the efficiency of energy conversion in today's safe, green and renewable energy technologies.

A single ZnO micro-/nanowire LED 100 was fabricated by manipulating a ZnO wire 110 on a trenched substrate. A Mg doped p-type GaN film 126 was epitaxially grown on a sapphire substrate 124 by metal organic chemical vapor deposition (MOCVD) and was used to form a p-n junction with n-type ZnO wire 110. An ITO coated 122 sapphire substrate 120 was used as the cathode that was placed side-by-side with the GaN substrate 126 with a well-controlled gap 128. The ZnO wire 110 was placed across the gap 128 with a close contact with the GaN film 126. A transparent polystyrene (PS) tape 130 was used to cover the ZnO nanowire 110. A normal force was applied on the PS film 130 by an alumina rod 136 connected to a piezo nano-positioning stage (not shown). In this case, a compressive stress was applied uniformly normal to the interface between the side surface of the ZnO wire 110 and the GaN substrate surface 126. Such a compressive force along the a-axis of the ZnO wire 110 resulted in a tensile strain along the c-axis, the growth direction of the wire 110. In this embodiment, there was no transverse bending or twist on the wire 110 to ensure the stability of the p-n junction interface between the ZnO wire 110 and GaN substrate 126.

The external efficiency of an as-fabricated single wire LED was measured conservatively to be about 1.84% before applying a strain, which is as high as that for a single p-n junction based UV LED. To test the strain effect on a single ZnO wire LED, the experiment systematically investigated its output light intensity, electroluminescence spectra and polarization as the strain being applied. At a fixed applied bias above the turn-on voltage (3 V), the current and light emission intensity increased obviously with increase of the compressive strain. The significantly enhanced light intensity was also directly observed in optical images recorded by a CCD. The injection current and output light intensity were largely enhanced by a factor of 4 and 17, respectively, after applying a 0.093% a-axis compressive strain, indicating that the conversion efficiency was improved by a factor of 4.25 in reference to that without applying strain. This means that the external true efficiency of the LED can reach about 7.82% after applying a strain.

To confirm the validity of the observed data, the stability of the contact between ZnO wire and GaN was carefully examined by repeating the applied strain. Once the strain was retracted, the light emission intensity dropped back to the value observed at strain free case. A linear relationship observed in the enhancement factor with strain proved that a possible change in contact area between n- and p-side of the device was not responsible to the observed increase in efficiency.

Figures 2A, 2B:
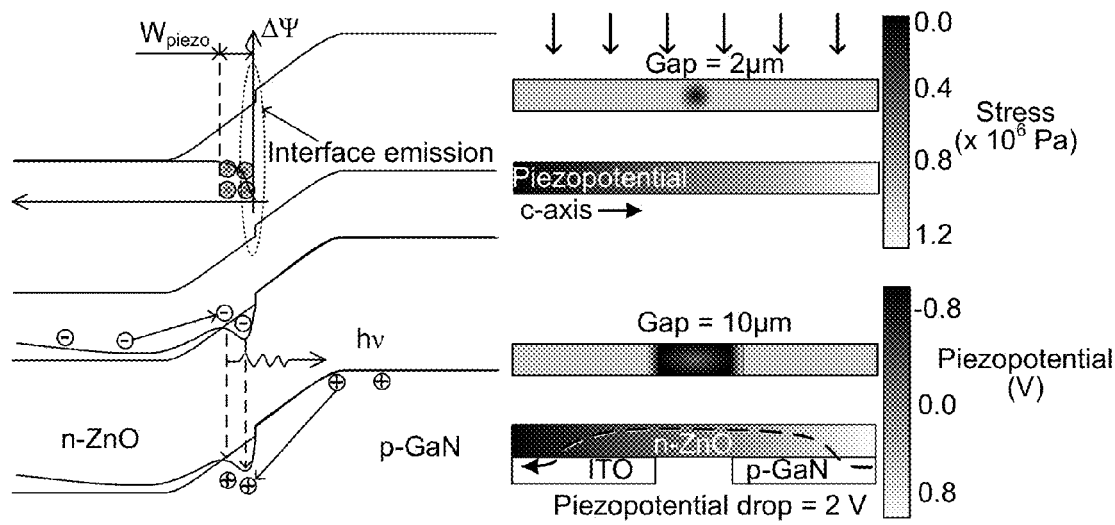
FIG. 2A is a schematic energy band diagram demonstrating band relationships in piezoelectric semiconducting devices with different amounts of strain applied thereto.
FIG. 2B is a schematic diagram demonstrating stress being applied to a piezoelectric structure and corresponding piezopotentials resulting therefrom.

As shown in FIGS. 2A and 2B, when the n-ZnO wire/p-GaN substrate LED is under axial straining, two typical effects influence the output light intensity and spectra. One is the piezoresistance effect, which is caused by the change in bandgap and possibly density of states in the conduction band. This effect acts as adding a serial resistance to the LED. The second effect is the piezo-phototronic effect, which is about the tuning of the optoelectronic process at the interface using the piezopotential created along the ZnO wire. ZnO has a non-central symmetric crystal structure, in which the cations and anions are tetrahedrally coordinated. A straining on the basic unit results in a polarization of the cations and anions, which is the cause of the piezopotential inside the crystal. As for the ZnO (n-type)—GaN (p-type) LED, a schematic diagram of its band structure is presented in FIG. 2A.

Since the size of the GaN substrate is much larger than that of the ZnO microwire, the strain in GaN is much smaller than that in ZnO, thus the focus is on the piezoelectric effect from ZnO. Under an assumption of no-doping or low-doping in ZnO for simplicity, numerically calculated piezopotential distribution in the ZnO microwire, as shown in FIG. 2B, shows that a negative potential drop is created along its length when the ZnO microwire is under a-axis compressive strain. The finite doping in the wire may partially screen the piezoelectric charges, but it cannot totally eliminate the piezoelectric potential if the doping level is low, thus a dip in the band is possible. The low-doping in ZnO wire here is consistent with our experiment results because the ZnO wire is fabricated by a high-temperature thermal evaporation process using pure ZnO powders as the source. If the c-axis of the ZnO wire is pointing from the ITO side to the GaN side, as shown in FIG. 2B, the effect of the local negative piezopotential at the ITO side is equivalent to applying an extra forward biased voltage on the device. Thus, the depletion width and internal field are reduced under this additional component of forward biased voltage. Subsequently, the injection current and emitting light intensity under the same externally applied forward voltage increase when the device is strained. Alternatively, if the c-axis of the ZnO wire is reversed and pointing away from the GaN side, the GaN side has a lower piezopotential, which is equivalent to applying an extra reversely biased voltage on the device. The depletion width and internal field are thus increased, resulting in a reduction of the injection current and emitting light intensity with the increase of the applied strain.

The light output of LED is proportional to the external efficiency and injection current. Meanwhile, the injection current across the p-n junction increases exponentially with the increase of the forward bias voltage (for V>>kT/q) according to the Shockley equation. Therefore, the change in light emission intensity under strain can be described by):

$$\ln\left(\frac{\Phi_{out}(\varepsilon)}{\Phi_{out}(0)}\right) = \ln\left(\frac{I(\varepsilon)}{I(0)}\right) + \left(\frac{\eta_{ex}(\varepsilon)}{\eta_{ex}(0)}\right) = \frac{\Delta\psi}{kT} + f(\varepsilon)$$

where $\eta_{ex}(\varepsilon)$ and $\eta_{ex}(0)$ represent the output external efficiency of LED with and without applying a strain, respectively, k is the Boltzmann constant, T is temperature, and $f(\varepsilon)$ represents the effect of strain on external efficiency.

The enhancement factor for light emission was larger than that for the injection current, which means that the quantum efficiency was enhanced with the increase of strain according to the above equation. By solving Poisson equation with coupling piezoelectric effect, the enhancement of external efficiency may be caused by the localized positive piezopotential near GaN/ZnO interface, which produces carrier trapping channels (as shown in FIG. 2A). Electrons and holes can be temporarily trapped and accumulated in the channels in the conduction and valance band, respectively. Since abundant electrons are available in ZnO, for instance, the efficiency of the LED is largely dominated by the local concentration of holes because of the high activation energy of the most commonly used acceptor dopants (Mg) in GaN (~200 meV). The trapped holes may increase the hole injection from p-GaN into n-ZnO, which increases the recombination efficiency of electrons and holes near the junction, resulting in a large increase in emission intensity. It is pointed out that, though the absolute values of the band offset varies in different reports, and is dependent on the fabrication process of the heterojunction, the band offset values do not affect the tendency of the band modification and the profile of the carrier trapping channel by piezopotential.

The peak positions of the four emission bands did not exhibit any appreciable shift under straining, but they did have obvious blue shift as the applied bias voltage was increased. The bandgap of ZnO decreases under compressive a-axis strain, while the bandgap of GaN also decreases under compressive c-axis strain. In this case, the peak position should have a red shift under compressive strain. On the other hand, the emission centers of the n-ZnO/p-GaN LED have blue shift with the increase of injection current due to the band renormalization, band filling at high current and/or the increased kinetic energies of electrons and holes. When these two complementary effects co-exist, one may balance the other, resulting in negligible shift in emission peaks. The change in refraction index of ZnO is also possible under strain, which is the photoelastic effect.

The performance of an LED is dictated by the structure of the p-n junction and the characteristics of the semiconductor materials. Once an LED is made, its efficiency is determined largely by the local charge carrier densities and the time at which the charges can remain at the vicinity of the junction. The latter is traditionally controlled by growing a quantum well or using a built-in electronic polarization for "trapping" electrons and holes in the conduction and valance bands, respectively. Instead of using this pre-fabricated structure, the piezopotential is created in ZnO by strain to control the charge transport process at the ZnO—GaN interface, demonstrating the first LED whose performance is controlled by piezoelectric effect. The emission intensity and injection current at a fixed applied voltage have been enhanced by a factor of 17 and 4 after applying a 0.093% compressive strain, respectively, and the corresponding conversion efficiency has been improved by a factor of 4.25 in reference to that without applying strain! And an external efficiency of 7.82% has been achieved. This significantly improved performance is not only attributed to the increase of injection current by the modification of the band profile, but also to the effect of the creation of a trapping channel for holes near the heterojunction interface, which greatly enhances the external efficiency. An increase in UV-to-visible ratio and stabilization of the peak position show that the spectrum quality is improved by external straining. In addition, the polarization of the output light has been modulated by the piezooptic effect. This discovery is important not only for exploring the piezo-phototronic effect through a three-way coupling among mechanical, electronic and optical properties, but also can largely improve the efficiency and performance of LEDs and the design of a large range of optoelectronic devices based on ZnO and GaN with the use of their piezoelectric property.

Figure 3:
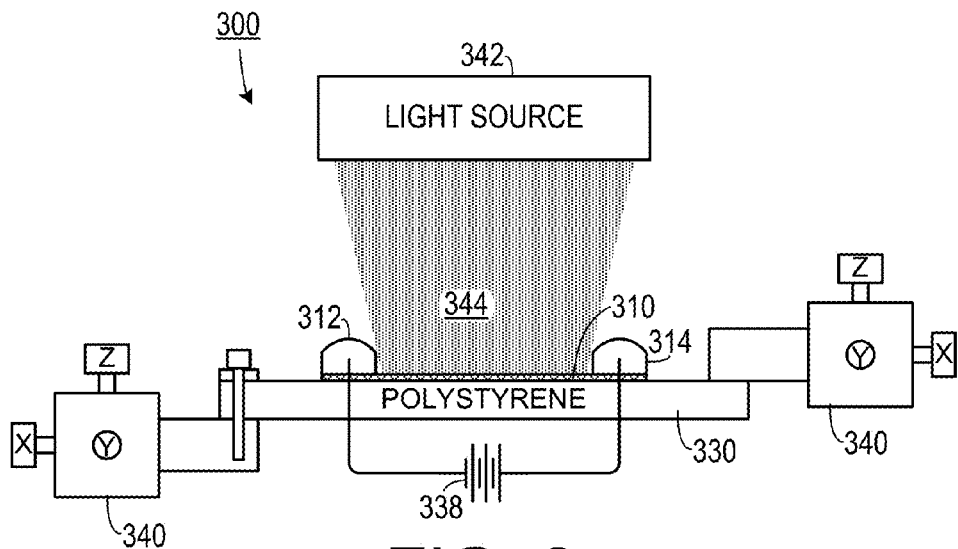
FIG. 3 is a schematic diagram of a light detecting device.

In another embodiment, as shown in FIG. 3, the device may be configured as a photo detector 300. An experimental version of this embodiment includes a metal-semiconductor-metal structure (MSM). The contacts 312 and 314 at the two ends of the semiconductor wire 310 are two back-to-back Schottky contacts. The device was fabricated by bonding a ZnO micro/nanowire 310 laterally on a polystyrene (PS) substrate 330, which has a thickness much larger than the diameter of the ZnO micro/nanowire 310. The mechanical behavior of the device was dominated by the substrate by considering the relative size of the wire 310 and the substrate 330. Strain was induced in the nanowire 310 by two strain-inducing structures 340 that were coupled to opposite ends of the PS substrate 330. A bias voltage from a voltage source 338 was applied to the contacts 312 and 314. The strain in the wire 310 was mainly axial compressive or tensile strain depending on the bending direction of the PS substrate 330, and it was quantified by the maximum deflection of the free end of the substrate. Monochromatic UV, blue and green light 334 from a light source 342 illuminated the ZnO wire 310 to test the performance of the device. The photocurrent flowing through the nanowire 310 was a function of the intensity of the light 344 and the strain induced in the nanowire 310.

The ZnO micro/nanowires used in one experimental embodiment were synthesized by a high-temperature thermal evaporation process. A single ZnO wire 310 was bonded on a PS substrate 330 (typical length of about 7 cm, a width of about 15 mm and thickness of 0.5 mm) with silver paste. A very thin layer of polydimethylsiloxane (PDMS) (not shown) was used to package the device, which kept the device mechanically robust under repeated manipulation and prevented the semiconductor wire from contamination or corrosion. A 3D stage 340 with movement resolution of 1 µm was used to bend the free end of the device to produce a compressive and tensile strain. Another 3D stage 340 was used to fix the sample under microscope and to keep the device in focus during the substrate bending process.

A Nikon Eclipse Ti inverted microscope system was used to monitor the sample and excite the photodetector. A Nikon Intensilight C-HGFIE lamp with a remote controller was used as the excitation source 342. Monochromatic UV (centered at 372 nm), blue (centered at 486 nm) or green light (centered at 548 nm) was illuminated on the ZnO wire to test the performance of the device, which was focused by a 10× microscope objective with a 17.5 mm work distance. Monochromatic light was obtained by a filter block between the source and microscope objective. There were three sets of filter blocks which used to obtain monochromatic UV, blue and green light. The optical power density impinging on the nanowire photodetector was varied by means of neutral density filters. The illumination density was determined by a thermopile power meter (Newport 818P-001-12). I-V measurement was obtained by applying an external bias to the wire and recorded using a Keithley 487 picoammeter/voltage source in conjunction with a GPIB controller (National Instruments GPIB-USB-HS, NI 488.2). In order to compare and analyze the results, time dependent photocurrent, light intensity dependent photocurrent and photocurrent used for analyzing responsivity and strain effects were measured at a fixed applied bias of −5 V from the voltage source 338.

Figure 4:
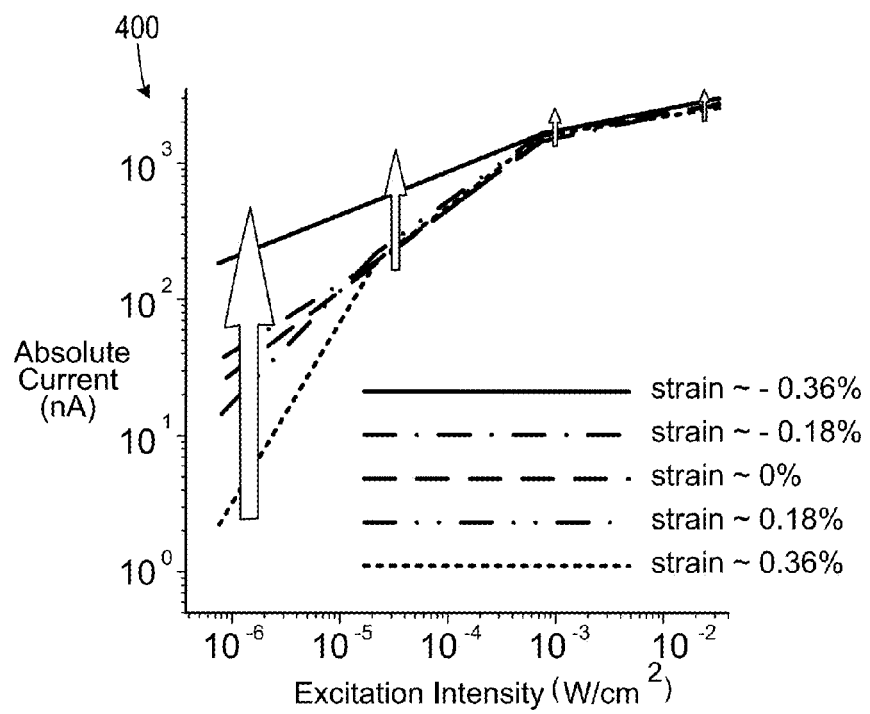
FIG. 4 is a graph relating absolute current to excitation intensity detected in the device shown in FIG. 3.

As shown in FIG. 4, the photocurrent increased linearly with the optical power and showed no saturation at high power levels, offering a large dynamic range from sub-µW/cm² to mW/cm². The total responsivity of the photodetector, $\mathscr{R}$, is defined as $$\mathscr{R} = \frac{I_{ph}}{P_{ill}} = \frac{\eta_{ext} q}{h\nu} \cdot \Gamma_G \quad (1)$$

$$P_{ill} = I_{ill} \times d \times l \quad (2)$$

where $\mathscr{R}$ is the responsivity, $I_{ph}$ photocurrent, $P_{ill}$ the illumination power on the photodetector, $\eta_{ext}$ the external quantum efficiency, q the electronic charge, h Planck's constant, ν the frequency of the light, $\Gamma_G$ the internal gain, $I_{ill}$ the excitation power, d the diameter of the ZnO wire, l is the spacing between two electrodes. Remarkably, the calculated responsivity of the device is super high, approximately 4.5×10⁴ A W⁻¹ at an intensity of 0.75 µW/cm² of UV light illumination. The internal gain can be estimated to be 1.5×10⁵ by assuming $\eta_{ext}$=1 for simplicity. The high internal gain and high responsivity is attributed to the oxygen-related hole trapping states and the shrinking of the Schottky barrier upon illumination.

This embodiment behaves as a single ZnO wire sandwiched between two back-to-back Schottky diodes. When a relatively large negative voltage was applied, the voltage drop occurred mainly at the reversely biased Schottky barrier $\phi_d$ at the drain side, which is denoted as $V_d \approx V$. Under reverse bias and in the dark condition, thermionic emission with barrier lowering is usually the dominant current transport mechanism at a Schottky barrier, which can be described by the thermionic-emission-diffusion theory (for $V >> 3$ kT/q~77 mV) as:

$$I_{TED}^{dark} = SA^{**}T^2 \exp\left(-\frac{q\phi_d^{dark}}{kT}\right) \times \exp\left[\sqrt[4]{\frac{q^7 N_D\left(V + V_{bi} - \frac{kT}{q}\right)}{8\pi^2 s_s^s}} \Big/ kT\right] \quad (3)$$

$$V_{bi} = \phi_d^{dark} - (E_C - E_f) \quad (4)$$

in which S the area of the Schottky contact, $A^{**}$ the effective Richardson constant, T the temperature, q the unit electronic charge, k the Boltzmann constant, $N_D$ the donor impurity density, V the applied voltage, $V_{bi}$ the built-in potential, and $\epsilon_s$ the permittivity of ZnO.

The effect of photo illumination on semiconductor thermionic emission is to lower the energy barrier by the difference between the quasi-Fermi level with photoexcitation and the Fermi level without photoexcitation and to reduce the width of depletion layer by photon generated holes trapping in the depletion layer. The current transport mechanism with illumination can be describes as:

$$I_{TED}^{ill} = SA^{**}T^2 \exp\left(-\frac{q(\phi_d^{dark} - (E_{FN} - E_f))}{kT}\right) \times \quad (5)$$

$$\exp\left[\sqrt[4]{\frac{q^7 N_D\left(V + V_{bi} - \frac{kT}{q}\right)}{8\pi^2 s_s^s}} \Big/ kT\right]$$

$$= SA^{**}T^2 \exp\left(-\frac{q\phi_d^{ill}}{kT}\right) \times \exp\left[\sqrt[4]{\frac{q^7 N_D\left(V + V_{bi} - \frac{kT}{q}\right)}{8\pi^2 s_s^s}} \Big/ kT\right]$$

where $E_{FN}$ is quasi Fermi level with illumination.

By assuming S, $A^{**}$, T, $N_D$ are independent of strain at small deformation, the change of Schottky barrier height (SBH) with strain upon illumination can be determined by:

$$\ln\left(\frac{I(\epsilon_{xx})}{I(0)}\right) = -\Delta\phi_d^{ill}/kT \quad (6)$$

where $I(\epsilon_{xx})$ and $I(0)$ are the current measured through the ZnO wire at a fixed bias with and without strain applied, respectively.

The contributions from band structure effect to SBH in source and drain contacts are denoted as $\Delta\phi_{d-bs}$ and $\Delta\phi_{s-bs}$, respectively. Assuming the axial strain is uniform in the ZnO wire along its entire length, $\Delta\phi_{d-bs} = \Delta\phi_{s-bs}$ if the two contacts are identical. This is the piezoresistance effect, which is symmetric and has equal effects regardless the polarity of the voltage. The asymmetric change of I-V curve at negative and positive bias in our case is dominated by piezoelectric effect rather than piezoresistance effect. The effect of piezopotential to the SBH can be qualitatively described as follows. For a constant strain of $\epsilon_{xx}$ along the length of the wire, an axial polarization $P_x = \epsilon_{xx} e_{33}$ occurs, where $e_{33}$ is the piezoelectric tensor. A potential drop of approximately $V_p^+ - V_p^- = \epsilon_{xx} L e_{33}$ is along the length of the wire, where L is the length of the wire. Therefore, the modulations to the SBH at the source and drain sides are of the same magnitude but opposite sign ($V_p^+ = -V_p^-$), which are denoted by $\Delta\phi_{d-pz}$ and $\Delta\phi_{s-pz}$ ($\Delta\phi_{d-pz} = -\Delta\phi_{s-pz}$).

This embodiment includes a piezopotential tuned low dark-current ultrasensitive ZnO wire photodetector. The device remains low dark current characteristics while increasing the responsivity dramatically for pW level light detection by piezopotential. The derived change of barrier height with strain depends on excitation light intensity, the SBH changes faster at low light intensity than that at high light intensity. The physical mechanism is explained by considering both piezopotential effect and photon generated free charges screening effect. Three-way coupling of semiconducting, photonic and piezoelectric properties of semiconductor nanowires will allow tuning and controlling of electro-optical process by strain induced piezopotential, which is the piezo-phototronic effect, and it will also lead to further integration between piezoelectric devices with microelectronic and optomechanical systems.

Figure 5A:
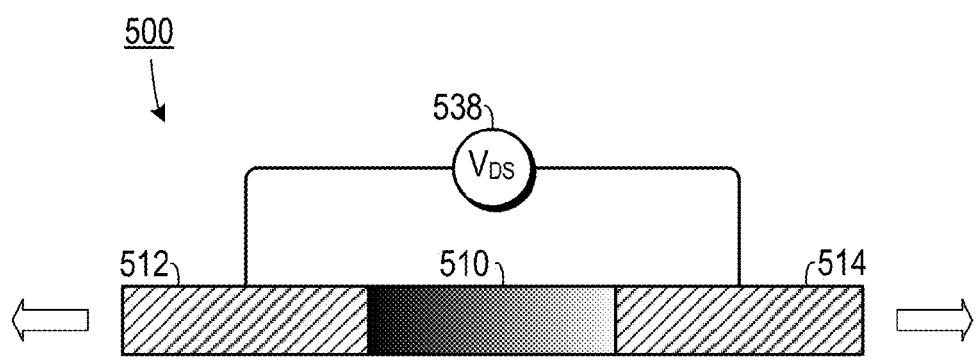
FIGS. 5A-5B are schematic diagrams of piezoelectric semiconducting switching devices.
Figure 5B:
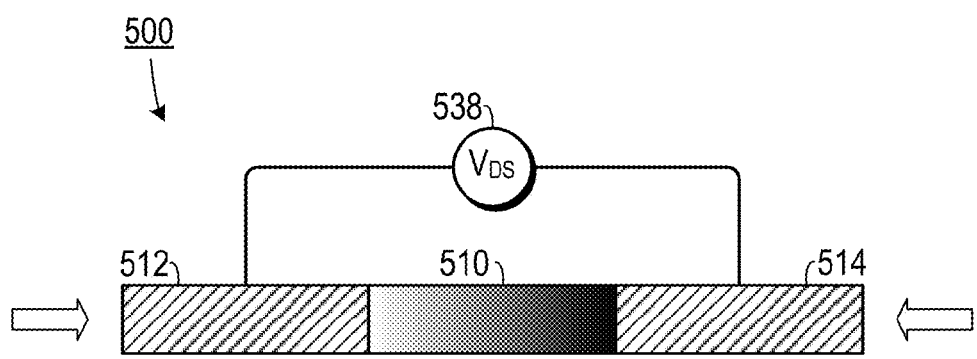

Another embodiment, as shown in FIGS. 5A-5B, includes a switching structure 500 that behaves like a transistor. The piezotronic transistor structure 500 includes a metal 512—nanowire 510—metal 514 structure that is biased by a voltage source 538. The metal portions 512 and 514 can include metals such as Au or Ag. In one embodiment, the nanowire 510 includes ZnO. The principle of the piezotronic transistor is to control the carrier transport at the M-S interface through a tuning at the local contact by creating a piezopotential at the interface region in the semiconductor by applying a strain. This structure is different from a typical MOS design, in that the externally applied gate voltage is replaced by an inner crystal potential generated by piezoelectric effect, thus, the "gate" electrode can be eliminated. This means that the piezotronic transistor needs only two leads: drain and source. Secondly, the control over channel width is replaced by a control at the interface. Since the current transported across an M-S interface is the exponential of the local barrier height at the reversely biased case, the ON and OFF ratio can be rather high due to the non-linear effect. Finally, a voltage controlled device is replaced by an external strain/stress controlled device, which is likely to have complimentary applications to CMOS devices.

The device 500 under tensile strain is shown in FIG. 5A and the device 500 under compressive strain is shown in FIG. 5B. When a ZnO nanowire device is under strain, there are two typical effects that may affect the carrier transport process. One is the piezoresistance effect because of the change in band gap, charge carrier density and possibly density of states in the conduction band of the semiconductor crystal under strain. This effect is a symmetric effect on the two end contact and has no polarity, which will not produce the function of a transistor. Piezoresistance is a common feature of any semiconductors such as Si and GaAs and is not limited to the wurtzite family. The other is the piezoelectric effect because of the polarization of ions in a crystal that has non-central symmetry, which has an asymmetric or non-symmetric effect on the local contacts at the source and drain owing to the polarity of the piezopotential. In general, the negative piezopotential side raises the barrier height at the local contact of metal n-type semiconductor, possibly changing a Ohmic contact to Schottky contact, a Schottky contact to "insulator" contact; while the positive piezopotential side lowers the local barrier height, changing a Schottky contact to an Ohmic contact. But the degree of changes in the barrier heights depends on the doping type and doping density in the nanowire. The piezoelectric charges are located at the ends of the wire, thus they directly affect the local contacts. The piezotronic effect is likely limited to the wurtzite family such as ZnO, GaN, CdS and InN. The polarity of the piezopotential can be switched by changing tensile strain to compressive strain. Thus, the device can be changed from a control at source to a control at drain simply by reversing the sign of strain applied to the device.

The above described embodiments, while including the preferred embodiment and the best mode of the invention known to the inventor at the time of filing, are given as illustrative examples only. It will be readily appreciated that many deviations may be made from the specific embodiments disclosed in this specification without departing from the spirit and scope of the invention. Accordingly, the scope of the invention is to be determined by the claims below rather than being limited to the specifically described embodiments above.

What is claimed is:

1. A semiconducting device, comprising:
   (a) a piezoelectric structure, having a first end and an opposite second end;
   (b) a first conductor in electrical communication with the first end;
   (c) a second conductor in electrical communication with the second end so as to form an interface therebetween;
   (d) a force applying structure configured to maintain an amount of strain in the piezoelectric member; and
   (e) a voltage source configured to apply a potential between the first conductor and the second conductor, wherein the piezoelectric structure emits light as a function of the amount of strain applied by the force applying structure and the potential applied between the first conductor and the second conductor.

2. The semiconducting device of claim 1, wherein the second conductor includes a material that forms with the piezoelectric member at the interface a selected one of a p-n junction or a Schottky contact.

3. The semiconducting device of claim 2, wherein a desired electrical characteristic exhibited at the interface comprises a predetermined band relationship at the interface.

4. The semiconducting device of claim 1, further comprising a non-conductive flexible substrate upon which the piezoelectric structure is disposed.

5. The semiconducting device of claim 1, wherein the piezoelectric structure comprises a selected one of a nanowire or a one-dimensional shape structure.

6. The semiconducting device of claim 1, wherein the piezoelectric structure comprises a selected one of ZnO, GaN, or a wurtzite structured material.

7. The semiconducting device of claim 1, wherein the first conductor comprises a material selected to form an Ohmic contact with the piezoelectric structure.

8. A semiconducting device configured as a light emitting device, comprising:
   (a) a piezoelectric structure including a wurtzite nanowire, having a first end and an opposite second end;
   (b) a first conductor in electrical communication with the first end;
   (c) a second conductor in electrical communication with the second end so as to form an interface therebetween; and
   (d) a force applying structure configured to maintain an amount of strain in the piezoelectric member sufficient to generate a desired electrical characteristic in the semiconducting device;
   (e) a Mg-doped GaN film deposited on a first $Al_2O_3$ substrate, the first conductor in electrical communication therewith;
   (f) an ITO film deposited on a second $Al_2O_3$ substrate, the second conductor in electrical communication therewith, the second $Al_2O_3$ substrate spaced apart from the first $Al_2O_3$ substrate so as to define a gap having a predetermined width therebetween, the wurtzite nanowire being placed across the gap; and
   (g) a voltage source electrically coupled to both the Mg-doped GaN film and the ITO film so as to be configured to generate a potential difference therebetween;
   (h) a polyimide film disposed on the force applying structure and on which is disposed both the first $Al_2O_3$ substrate and the second $Al_2O_3$ substrate; and
   (i) a transparent resilient layer disposed against wurtzite nanowire, the Mg-doped GaN film and the ITO film.

9. The semiconducting device of claim 8, wherein the force applying structure comprises an alumina rod configured to apply a force in a direction that is normal to an axis of the wurtzite nanowire.

10. A photodetector for detecting light from a light source, comprising:
    (a) a piezoelectric structure, having a first end and an opposite second end;
    (b) a first conductor in electrical communication with the first end and including a first metal that forms a Schottky contact therewith;
    (c) a second conductor in electrical communication with the second end and including a second metal that forms a Schottky contact therewith;
    (d) a strain-inducing structure configured to maintain an amount of strain in the piezoelectric member; and
    (e) a voltage source configured to apply a bias potential between the first conductor and the second conductor, the bias potential of a value so that current flows through the piezoelectric structure as a function of an intensity of light from the light source and the amount of strain maintained in the piezoelectric member.

11. The photodetector of claim 10, further comprising a non-conductive flexible substrate upon which the piezoelectric structure is disposed.

12. The photodetector of claim 11, wherein the flexible substrate comprises polystyrene.

13. The photodetector of claim 10, wherein the piezoelectric structure comprises a nanowire.

14. The photodetector of claim 10, wherein the piezoelectric structure comprises material selected from a group of materials consisting of: ZnO, GaN, and a wurtzite structured material.

* * * * *